(12) United States Patent
Sakuma

(10) Patent No.: US 7,154,767 B2
(45) Date of Patent: Dec. 26, 2006

(54) METHOD FOR MANUFACTURE OF SEMICONDUCTOR DEVICE

(75) Inventor: Shinzo Sakuma, Tokyo (JP)

(73) Assignee: Oki Electric Industry Co., Ltd, Tokyo (JP)

( * ) Notice: Subject to any disclaimer, the term of this patent is extended or adjusted under 35 U.S.C. 154(b) by 96 days.

(21) Appl. No.: 10/992,715

(22) Filed: Nov. 22, 2004

(65) Prior Publication Data

US 2005/0243593 A1 Nov. 3, 2005

(30) Foreign Application Priority Data

Apr. 28, 2004 (JP) ............................. 2004-132685

(51) Int. Cl.
*G11C 11/22* (2006.01)
(52) U.S. Cl. .................. 365/145; 365/63; 365/149
(58) Field of Classification Search ................ 365/145, 365/63, 149, 189.04
See application file for complete search history.

(56) References Cited

U.S. PATENT DOCUMENTS 6,434,038 B1 * 8/2002 Ohno ........................ 365/145
6,990,005 B1 * 1/2006 Saito ......................... 365/145
2003/0103405 A1 * 6/2003 Mano et al. ................ 365/226

FOREIGN PATENT DOCUMENTS

JP 09-064291 3/1997
JP 2002-093194 3/2002

* cited by examiner

*Primary Examiner*—Richard Elms
*Assistant Examiner*—Dang Nguyen
(74) *Attorney, Agent, or Firm*—Rabin & Berdo, P.C.

(57) ABSTRACT

A method for the manufacture of a ferroelectric memory. The ferroelectric memory includes a plurality of memory cells for storing binary data as polarization states of a ferroelectric. The method includes a data writing step of writing those binary data which will be read at a potential level lower than a reference potential level during data reading, to all of the memory cells prior to a heat treatment step.

15 Claims, 11 Drawing Sheets

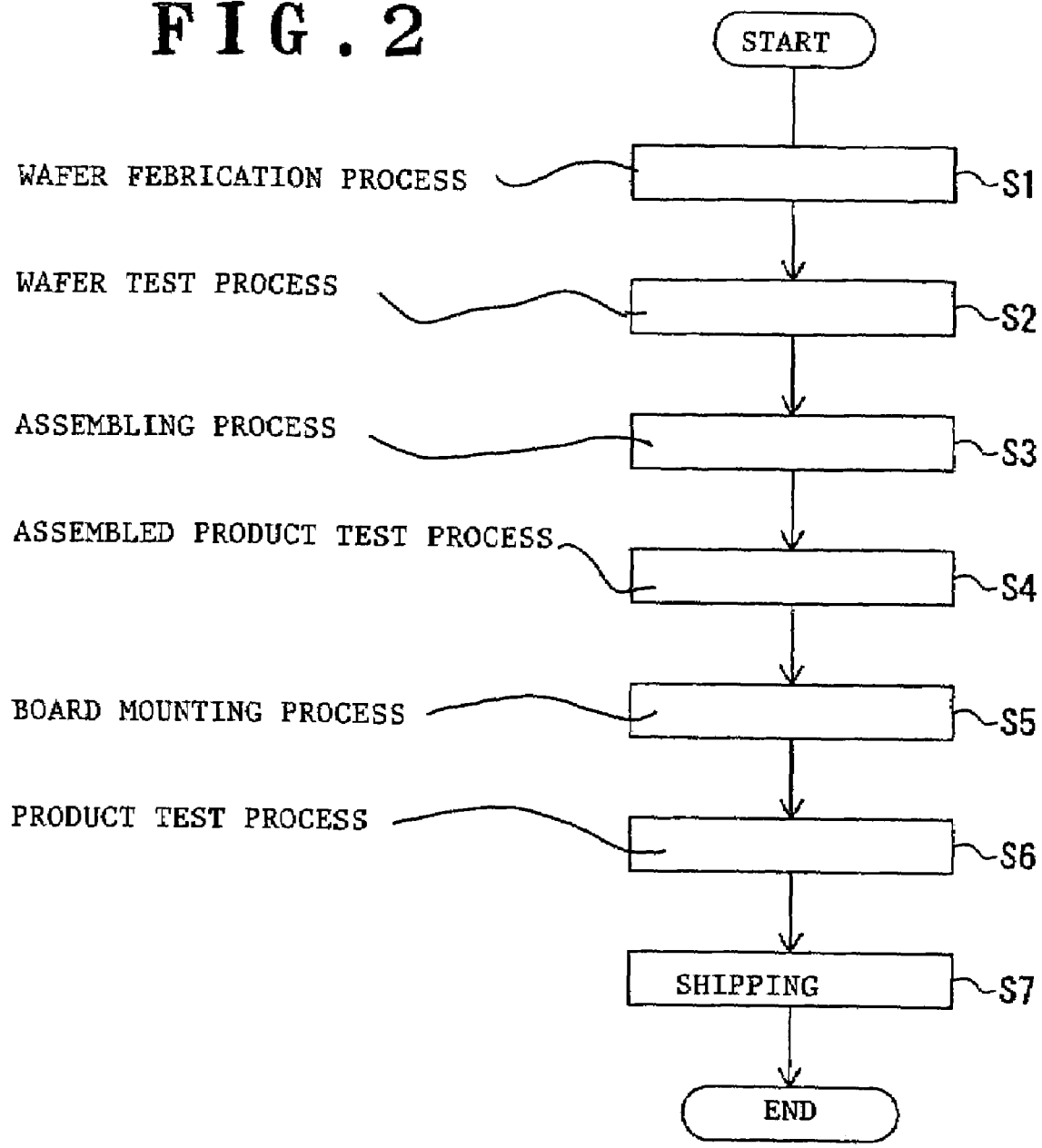

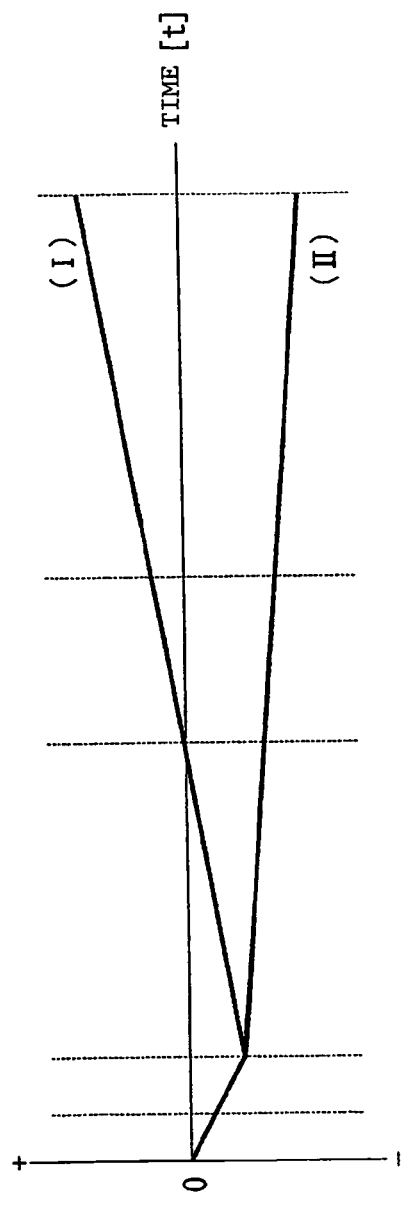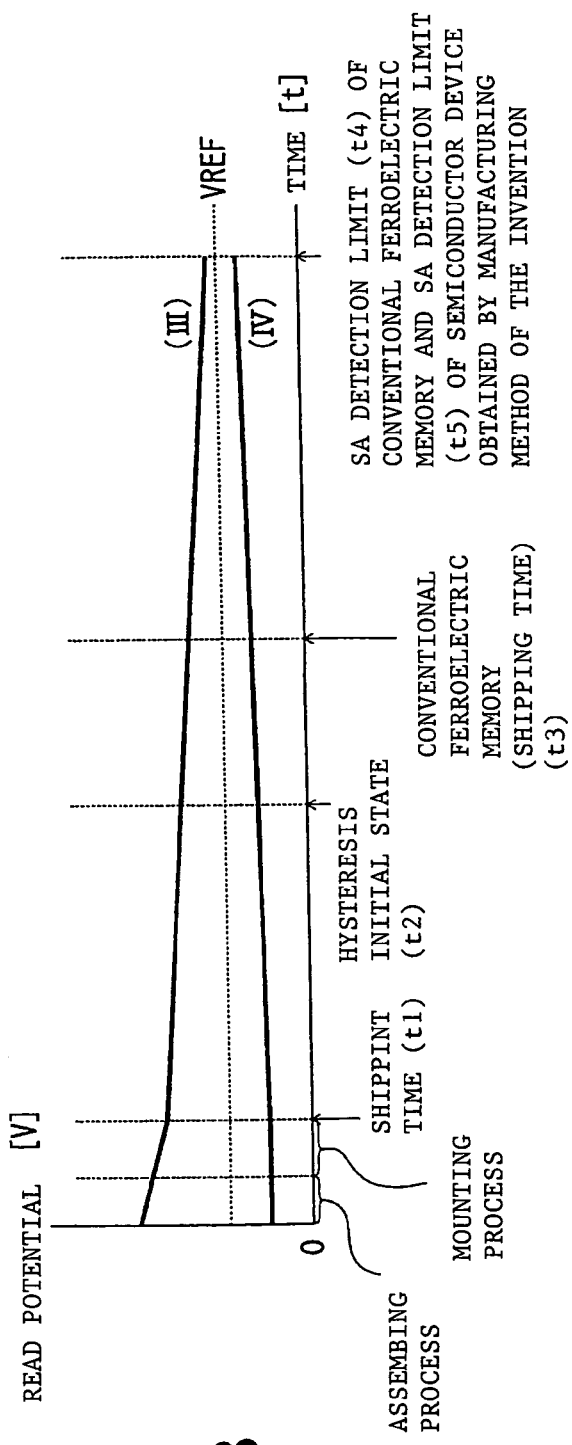
FIG. 4A
FIG. 4B

METHOD FOR MANUFACTURE OF SEMICONDUCTOR DEVICE

BACKGROUND OF THE INVENTION

1. Field of the Invention

The present invention relates to a method of manufacturing a semiconductor device. In particular, the present invention relates to a method of manufacturing a semiconductor device that includes a semiconductor chip having a plurality of memory cells for storing binary data as polarization states of a ferroelectric.

2. Description of the Related Art

FeRAM (Ferroelectric Random Access Memory) is known as the so-called ferroelectric memory. For example, the FeRAM can have a (2 transistor-2 capacitor)/1 bit structure (simply referred to hereinbelow as 2T2C structure). The FeRAM with the 2T2C structure is a FeRAM for storing one binary data in two memory cells, that is, in two transistors and two capacitors.

A ferroelectric memory (semiconductor chip) and a method for manufacture thereof are disclosed in, for example, Japanese Patent Kokai (Laid-open Application) No. 9-64291. The difference in physical and chemical properties between two interfaces, namely, an interface between a ferroelectric film and an upper electrode provided on the ferroelectric film and an interface between the ferroelectric film and the lower electrode provided below the ferroelectric film, is eliminated by conducting two heat treatments in the process for the manufacture of a memory element. If the difference in physical and chemical properties between these two interfaces is eliminated, it is possible to stabilize the operation of reading data from a memory cell and the operation of writing data into the memory cell because the symmetry of the hysteresis curve of a ferroelectric capacitor is improved.

Japanese Patent Kokai No. 2002-93194 discloses a process of inspecting a ferroelectric memory. In the so-called burn-in inspection process for screening the initial defects in the memory cells having ferroelectric capacitors, the occurrence of imprint effect is prevented by conducting a process of alternately writing "1" data and "0" data into individual memory cells in at least the temperature decrease period of the temperature increase period and temperature decrease period. If the imprint effect is prevented, it is possible to stop deterioration of the memory cells.

The relation between the imprint effect and memory cell deterioration will be described below with reference to FIGS. 10A–10C and FIGS. 11A–11B of the accompanying drawings.

FIGS. 10A–10C are conceptual graphs for explaining the state transition (change in hysteresis characteristic) of a ferroelectric capacitor provided in a ferroelectric memory. The hysteresis characteristic is shown by a dot line, and the hysteresis characteristic after the shift is shown by a solid line. The deterioration of the polarization quantity by the so-called depolarization is shown by a dash-dot line.

FIG. 10A shows a hysteresis characteristic which is considered ideal for the conventional ferroelectric memory. FIGS. 10B and 10C show the hysteresis characteristics that shift from the ideal curve due to occurrence of the imprint effect in the ferroelectric capacitor. A voltage, V (volts), is plotted against the abscissa, and polarization Pr ($\mu C/cm^2$) is plotted against the ordinate.

In this specification, the "0" data is the binary data which are written into a ferroelectric memory or read therefrom, and which is read at a potential level lower than the reference potential (VREF) level during data reading. The "1" data is a data which is read at a potential level higher than the reference potential (VREF) level during data reading.

FIGS. 11A and 11B are the graphs for explaining the shift with time in a memory cell (ferroelectric capacitor) when the memory cell holds the "0" or "1" data for a long time. Specifically, FIG. 11A schematically illustrates the amount of shift with time of a hysteresis characteristic in a memory cell that has been continuously storing the "1" data (graph I) or "0" data (graph II). FIG. 11B schematically illustrates the shift with time of a read potential with respect to the reference potential (VREF) of a ferroelectric memory. The graph III in FIG. 11B shows the changes in the read potential in a memory cell that stores the "1" data, and the graph IV shows the changes in the read potential in the memory cell that stores the "0" data.

As shown in FIGS. 10A, 10B, and 10C, the relationship between the voltage, V, and polarization, Pr, can be explained by the so-called hysteresis curve.

As understood from FIG. 10A, the hysteresis characteristic curve of a ferroelectric capacitor that has not shifted has a symmetrical shape with respect to the ordinate and abscissa for both the applied potential and the polarization quantity. The potential read from the ferroelectric capacitor in such a state is V0 in case of the "0" data and V1 in case of the "1" data.

As seen in FIG. 10B, the hysteresis curve in case of continuous holding of the "0" data for a long time shifts in the minus direction of the abscissa (voltage), that is, to the left, while maintaining its shape as a whole.

The read potential V0 in FIG. 10B is almost identical to the V0 in FIG. 10A, and the read potential V1 in FIG. 10B seems to be only slightly less than the V1 shown in FIG. 10A. Thus, the ferroelectric memory having the left-shifted hysteresis curve is able to operate with practically no problem.

As shown in FIG. 10C, the hysteresis curve observed when the "1" data is held for a long time shifts in the plus direction of the abscissa (voltage), that is, to the right, while maintaining its shape as a whole.

The difference between the read potentials V0 and V1 in FIG. 10C is much less than that shown in FIG. 10A and FIG. 10B. In a ferroelectric memory, data cannot be read if the difference between the potentials V0 and V1 is small. Thus, it can be understood that there is a high risk of impeding the operation of a ferroelectric capacitor if the hysteresis curve of the ferroelectric capacitor shifts in the plus direction of the abscissa (voltage axis), that is, to the right, by holding the "1" data for a long time.

A semiconductor device having a ferroelectric memory undergo a wafer process, a wafer test, an assembling process, an assembled product test, mounting of the product on a substrate, and a final test before they are shipped.

Those processes and tests inevitably include heating treatments at a high temperature. For example, in the assembling process, heating at a temperature of about 200° C. is carried out during wire bonding and sealing. In the mounting process, heating at a temperature of about 240° C. is carried out in the reflow process.

In the wafer test, the manufactured ferroelectric memory is subjected to an electric characteristic test with a high voltage, an endurance test involving a random number of operations, and a test for inspecting the effect of temperature on characteristics in which the operation is monitored under temperature conditions higher than the usual usage temperature.

In the assembling process and mounting process, thermal stresses are applied to the ferroelectric memory which holds the "0" or "1" data because the "0" or "1" data is written in the ferroelectric memory in the wafer test.

In a ferroelectric memory, the amount of shift of the hysteresis curve increases with time as shown in FIG. 11A, and the polarization quantity of the ferroelectric capacitor (i.e., the read potential) decreases with time as shown in FIG. 11B. The memory life limit is reached when the amplification of read potential by the sense amplifier (SA) becomes impossible due to the decrease in read potential. The hysteresis curve represents the characteristic of the ferroelectric memory.

The above-described imprint effect of a ferroelectric memory and the decrease in polarization quantity (depolarization) of a ferroelectric capacitor are accelerated by thermal stresses applied in the process for the manufacture of the ferroelectric memory and semiconductor device. Thus, the hysteresis characteristic of a memory cell has already shifted and the memory life has already been shortened to the extent of this shift at the time of product shipping. The shortening of service life is especially significant when the hysteresis curve has shifted to the right.

Japanese Patent Kokai No. 9-64291 teaches that the read potential can be stabilized by improving the symmetry of hysteresis curve. However, Japanese Patent Kokai No. 9-64291 does not mention the shortening of the memory cell life by heat treatment, and does not teach any measures for resolving this problem.

Japanese Patent Kokai No. 2002-93194 teaches that shortening of the memory life can be prevented by initializing the hysteresis characteristic at the time of product shipping so as to inhibit the occurrence of the imprint effect at the time of shipping. However, Japanese Patent Kokai No. 2002-93194 does not teach anything about substantive extension of memory life (not prevention of shortening of the life, but extension of the life).

Therefore, there is no technology for realizing service life extension of ferromagnetic memories.

SUMMARY OF THE INVENTION

It is one object of the present invention to provide a ferroelectric memory which has an extended service life.

Another object of the present invention is to provide a method of manufacturing a semiconductor device including the ferroelectric memory with extended service life.

According to one aspect of the present invention, there is provided an improved method of manufacturing a ferroelectric memory. The ferroelectric memory includes a plurality of memory cells adapted to store binary data as polarization states of a ferroelectric. The manufacturing method includes writing binary data that will be read at a potential level lower than a reference potential level during data reading (i.e., "0" data), to all of the memory cells prior to a heat treatment.

The heating treatment is conducted after writing the binary data that will be read at a potential level lower than the reference potential level at the time of data reading, that is, the "0" data. Therefore, the hysteresis curve of the ferroelectric memory at the time of product shipping is shifted in the minus direction of the abscissa (voltage), that is, to the left, while maintaining its shape as a whole. The service life of the memory cell can be extended by the interval required for the hysteresis curved in such a shifted state to change its position to an ideal position with a zero shift.

The service life of a ferroelectric memory can be thus extended by adding a simple step of writing data into a memory cell prior to heating treatment.

The ferroelectric memory may include a write test circuit used in the above-described writing step.

The write test circuit includes an OR circuit and a NOR circuit. An output of the OR circuit is connected to a bit line precharge circuit of the ferroelectric memory and an input of the OR circuit is connected to a first signal line for inputting a bit line precharge signal and a second signal line for inputting a test signal. An output of the NOR circuit is connected to a sense amplifier and an input of the NOR circuit is connected to a third signal line for inputting a sense amplifier activation main control signal and the second signal line.

The write test circuit facilitates the implementation of the data writing conducted prior to heating treatment.

The ferroelectric memory may include a word line potential selection circuit. When binary data is read from a certain memory cell that stores the binary data that will be read at a potential level higher than the reference potential level, the word line potential selection circuit conducts data writing into this memory cell at a potential level lower than a power source potential.

This word line potential selection circuit receives the potential selection signal and outputs signals of two different potentials corresponding to this potential selection signal into the word driver circuit.

The word line potential selection circuit can delay the shift of the hysteresis curve of the memory cell in the plus direction of the abscissa (voltage), that is, to the right, while maintaining its shape as a whole. Therefore, the extension of service life of the ferroelectric memory can be realized.

The write test circuit and word line potential selection circuit can have a very simple circuit configuration. Therefore, the ferroelectric memory can demonstrate the above-described advantages, without producing the adverse effect on the layout of circuit pattern, even though those circuits are added.

The semiconductor device of the present invention includes such ferroelectric memory, and can enjoy the same advantages as the ferroelectric memory (i.e., extension of service life).

These and other objects, aspects and advantages of the present invention will become apparent to those skilled in the art from the detailed description and appended claims when read and understood in conjunction with the accompanying drawings.

BRIEF DESCRIPTION OF THE DRAWINGS

FIG. 2 is a schematic flowchart of a process for manufacturing a semiconductor device in accordance with the present invention;

FIGS. 4A and 4B are schematic graphs useful to explain the service life of a semiconductor device manufactured by the manufacturing method in accordance with the present invention;

DETAILED DESCRIPTION OF THE INVENTION

Figure 1:
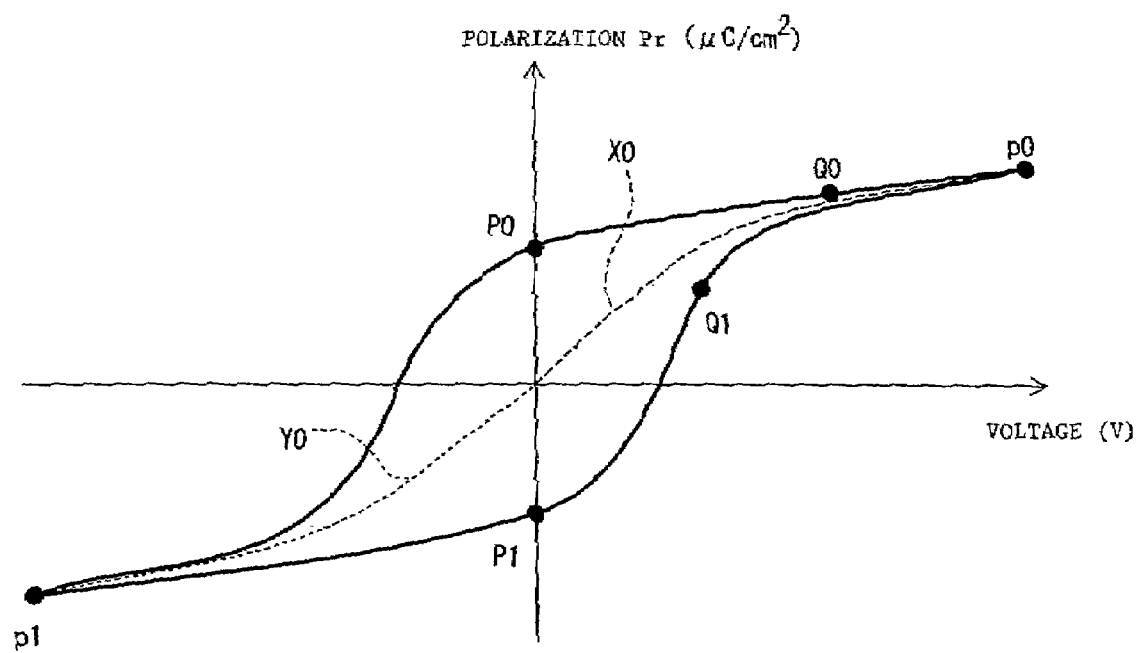
FIG. 1 is a schematic hysteresis curve of a ferroelectric memory.

Embodiments of the present invention will be described below with reference to the accompanying drawings. In the drawings, the constituent components and waveforms are merely schematic representations employed to facilitate understanding of the present invention and numerical conditions presented hereinbelow should be construed merely as examples.

1. Operation of Ferroelectric Memory

The write and read operation of a ferroelectric memory will be described below with reference to FIG. 1.

FIG. 1 is a schematic hysteresis curve for explaining the operation of a ferroelectric memory. A voltage, V (volt), is plotted against the abscissa, and polarization, Pr ($\mu C/cm^2$), is plotted against the ordinate.

First, a write operation will be explained. Initially, a polarization is induced in a ferroelectric capacitor. When the "0" data is written into a ferroelectric memory, a voltage in the positive direction is applied. As shown in FIG. 1, the polarization state of the ferroelectric capacitor changes along the first dot line X0 and reaches the point p0. When the "1" data is written into the ferroelectric memory, a voltage in the negative direction is applied. At this time, the polarization state of the ferroelectric capacitor changes along the second dot line Y0 and reaches the point p1.

If the application of voltage to the ferroelectric capacitor is interrupted, the polarization state of the ferroelectric capacitor shifts in the direction of canceling the polarization, but the polarization is not completely erased. For example, the polarization state of the ferroelectric capacitor into which "0" data is written remains in the point P0, and the polarization state of the ferroelectric capacitor into which "1" data is written remains in the point P1.

A read operation will be then described. A voltage in the positive direction is applied, and an electric charge of certain quantity is provided to the ferroelectric capacitor. As a result, the polarization state of the ferroelectric capacitor shifts to the point Q0 when the "0" data is written into the ferroelectric memory and shifts to the point Q1 when the "1" data is written to the ferroelectric memory. The "0" data or "1" data can be read by comparing a potential of the point Q0 or a potential of the point Q1 with a reference potential applied from the outside.

2. Method for Manufacturing a Semiconductor Device

A process for the manufacture of a semiconductor device in accordance with the present invention will be described with reference to FIG. 2.

FIG. 2 is a schematic flowchart for explaining the process for manufacturing a semiconductor device. Each process or step shown hereinbelow sometimes includes multiple processing steps (substeps). Details of such substeps are not the essence of the present invention and detailed description thereof is omitted.

As shown in FIG. 2, first, a ferroelectric memory (semiconductor chip) is fabricated at a wafer level by the usual wafer process (S1). In this step, any of a write test circuit and a word line potential selection circuit, or both those circuits, are produced; this will be described in greater detail below.

Then a wafer test process for testing various characteristics of the ferroelectric memory at a wafer level is executed (S2).

An assembling process is then carried out in which ferroelectric memories are chipped as semiconductor chips from the wafer and assembled as packages (S3).

The assembly process generally involves heating treatment in which the ferroelectric memory is exposed to a high temperature, for example, in a wire bonding step or sealing step.

The heating treatment is a process in which the ferroelectric memory is exposed, for example, to a temperature of about 200° C. Therefore, it involves not only a step implemented with the object of heating the ferroelectric memory, but any process in which the ferroelectric memory is exposed to a high temperature whatever the object (intent) is.

Prior to conducting such heating treatment, the "0" data is written into all the memory cells of the ferroelectric memory.

Due to such heating treatment process, a hysteresis curve shifted in the minus direction of the abscissa (voltage), that is, to the left, while maintaining its shape as a whole, is imprinted in the ferroelectric capacitor of the ferroelectric memory into which the "0" data has been written in advance.

A process of testing the assembled component is then carried out (S4).

A process of mounting the assembled component on a substrate is thereafter carried out (S5). This mounting process completes the production of a semiconductor device that can be shipped as a product.

When the mounting process includes a heating treatment process, for example, such as a reflow process, the process of writing the "0" data is executed prior to executing the heating treatment process in the mounting process (S5).

A product test process is then carried out with respect to the completed semiconductor device (S6).

Only the semiconductor devices that pass the product test process (S6) will be shipped (S7).

As described above, a process of writing the "0" data is executed after each of the wafer test process (S2), assembling test process (S4), and product test process (S6) is completed and before heating treatment is carried out in respective subsequent processes. When the heating treatment is conducted after completion of the wafer test process, completion of the assembling test process, and completion of the product test process, a process of writing the "0" data is executed after each process and before the heating treatment.

For example, when an assembling process including multiple cycles of heating treatment is conducted after completion of the wafer test process and then an assembled product test process is conducted after completion of the assembling process, the process of wiring the "0" data may be executed prior to conducting the very first heating treatment in the multiple heating treatment. However, when the second and subsequent heating treatment are carried out, the "0" data have to be present into all the memory cells.

In the above-described example, the "0" data is written as preprocessing of the heat treatment during the semiconductor manufacturing process. However, this is not always necessary. For example, it is also possible to write the "0" data in combination with heat treatment immediately prior to shipping (i.e., after the manufacturing process or at the very end of the manufacturing process) and to carry out imprinting such that the hysteresis curve shifts in the minus direction of the abscissa (voltage), that is, to the left, while maintaining its shape as a whole. In this case, heating treatment may be conducted by using a high-temperature tank.

A shift with time of the hysteresis characteristic of the semiconductor device (ferromagnetic memory) in accordance with the present invention will be explained hereinbelow with reference to FIGS. 3A to 3C.

Figure 3A:
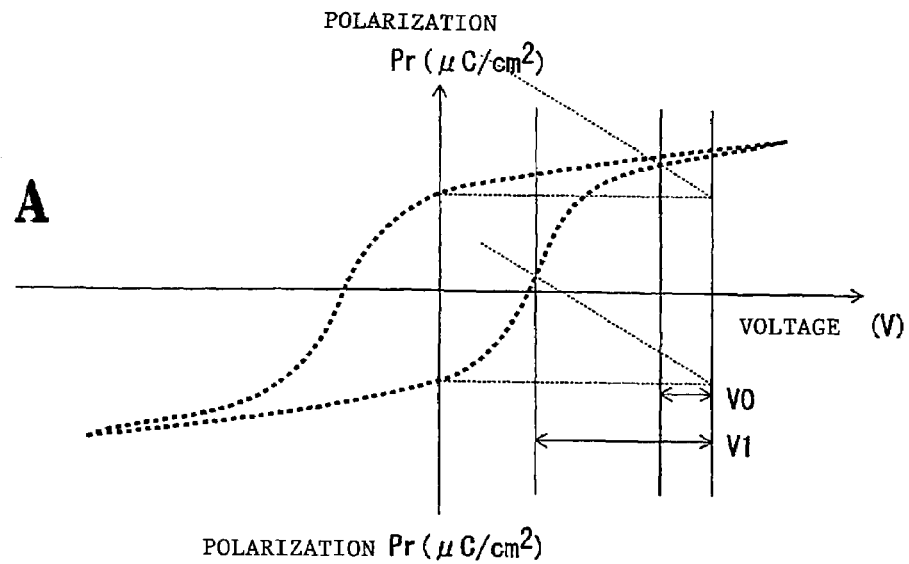
FIGS. 3A to 3C are a series of graphs useful to explain the changing hysteresis characteristic.
Figure 3B:
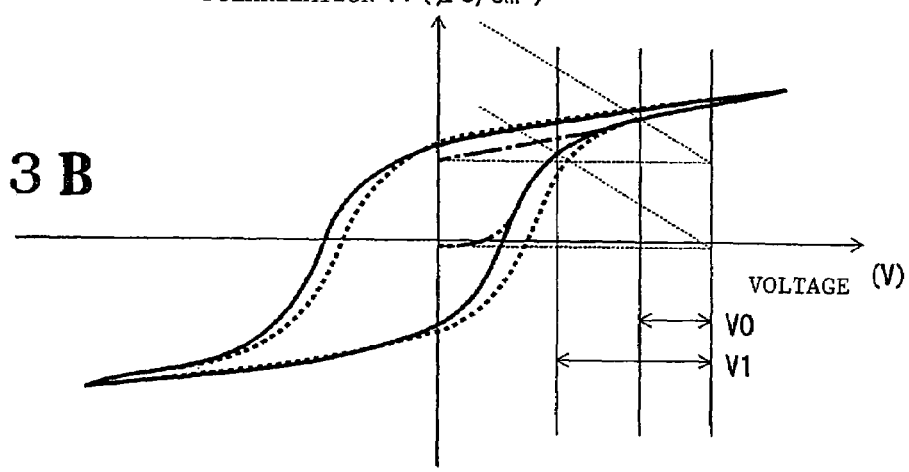
Figure 3C:
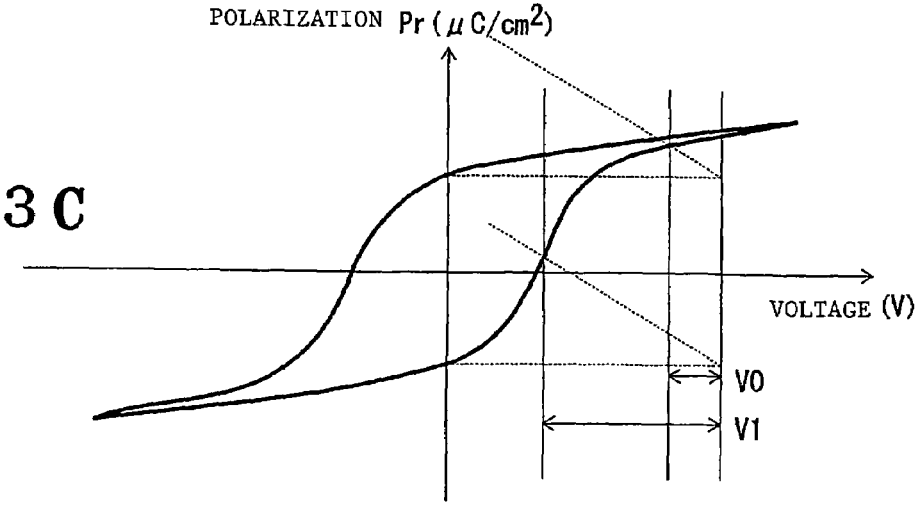

FIGS. 3A to 3C are conceptual graphs illustrating hysteresis characteristics. The hysteresis characteristic in the initial state is shown by a dot line, and the hysteresis characteristic after the shift is shown by a solid line.

FIG. 3A shows a hysteresis characteristic of a ferroelectric memory in the initial state (time t0) in which the hysteresis curve representing the characteristics of the ferroelectric capacitor has not been shifted by heating treatment or usage. FIG. 3B shows a state in which an imprinting effect has occurred in the ferroelectric capacitor and the hysteresis characteristic has been changed (shifted) by the process of writing the "0" data and subsequent heating treatment. This is a state at a product shipment time (i.e., time t1 in FIGS. 4A and 4B) for the semiconductor device. FIG. 3C shows a state at a time (time t2 in FIGS. 4A and 4B) in which the hysteresis curve, which shifts with time, almost shifts to the initial state due to usage of the semiconductor device after shipping.

A voltage, V (volt), is plotted against the abscissa, and polarization, Pr ($\mu C/cm^2$), is plotted against the ordinate in each of FIGS. 3A to 3C. The deterioration of polarization quantity caused by the so-called depolarization is shown by a dash-dot line.

At the instant t1 of time, the read potential V0 during reading of the "0" data stored in the ferroelectric memory and the read potential V1 during reading of the "1" data stored in the ferroelectric memory do not show significant changes, as compared with the read potentials V0 and V1 at the instant t0. "No significant changes" means no adverse effect on the operation.

In the memory cell storing the "0" data, the hysteresis curve representing the memory cell characteristic has been shifted (imprinted) in the minus direction of the abscissa (voltage), that is, to the left, while maintaining its shape as a whole, by the process of writing the "0" data and subsequent heating treatment. Therefore, the amount of changes in the read potential caused by usage is small.

On the other hand, the hysteresis curve of the memory cell where the "1" data has been stored shifts with time during usage in the plus direction, that is, to the right, of the abscissa (voltage), and the difference between the read potentials V0 and V1 gradually decreases. Therefore, data reading becomes impossible when a limit of a difference between the potentials V0 and V1 is attained. Thus, the service life of the ferroelectric memory cell is controlled (decided) by the deterioration of memory cells that continuously store the "1" data.

The service life of the ferroelectric memory (semiconductor device) manufactured by the manufacturing method in accordance with the present invention will be described below with reference to FIGS. 4A and 4B.

FIGS. 4A and 4B are schematic graphs for explaining the service life of the semiconductor device manufactured by the above-described manufacturing method.

FIG. 4A is a conceptual graph for explaining the amount of shift of the hysteresis curve with time. The time t is plotted against the abscissa, and the amount of shift of the hysteresis curve with time is plotted against the ordinate; the hysteresis curve represents the hysteresis characteristic of the ferroelectric memory. When the hysteresis curve shifts to the left with respect to the point of origin 0, the shift is represented by a minus (-) amount and when the hysteresis curve shifts to the right, the shift is represented by the plus (+) amount.

Graph I shows a shift of the hysteresis curve of the memory cell that has been continuously storing the "1" data, and graph II shows a shift of the hysteresis curve of the memory cell that has been continuously storing the "0" data.

FIG. 4B is a conceptual graph for explaining changes in the read potential with time. The time t matching the time in FIG. 4A is plotted against the abscissa and the read potential V is plotted against the ordinate. Graph III shows changes with time of the read potential V1 that is read from the memory cell that has been continuously storing the "1" data, and graph IV shows changes with time of the read potential V0 that is read from the memory cell that has been continuously storing the "0" data. The reference potential (VREF) which is referred to during data reading is represented by a dot line.

As shown by the graphs I and II in FIG. 4A, an imprint by conducting a heating treatment process after completion of each above-described test process has been conducted in all the memory cells of the ferroelectric memory provided in the semiconductor device of the present invention. Thus, at the shipping time t1, the hysteresis curve representing the characteristics of the ferroelectric memory cell has already been shifted in the minus direction of the abscissa (voltage), that is, to the left, while maintaining its shape as a whole.

As shown in the graph I, in the memory cell that has been continuously storing "1" data, the amount of hysteresis shift gradually increases in the plus direction, that is, to the right, from the shipping time t1, and reaches the detection limit t5 of the sense amplifier SA, that is, the service life of the memory cell.

As shown by the graph II, in the memory cell that has been continuously storing "0" data, the hysteresis shift amount increases gradually in the minus (-) direction from the shipping time t1 and reaches the detection limit t5 of the sense amplifier SA, that is, the service life of the memory cell.

As shown in FIG. 4B, in the semiconductor device of the present invention, an imprint shifting the hysteresis curve to the minus side (to the left) has been conducted at the shipping time t1.

As understood from the graphs III and IV, in the memory cell of the present invention, in which imprint has been conducted, the decrease with time of the read potential of the memory cell that has been continuously holding the "1" data is large, as described above, and almost no changes with time are observed in the read potential of the memory cell that has been continuously holding the "0" data.

As can be seen from the graphs III and IV, the hysteresis characteristic of the memory cell shifts during usage and arrives at (or returns to) the initial state at the instant t2 of time. The initial state is a characteristic state represented by the hysteresis curve shown in FIG. 3A, that is, a state substantially without a shift. Then, at the instant t3 of time, the hysteresis characteristic of the ferroelectric memory arrives at a state corresponding to that at the shipping time of the conventional ferroelectric memory.

As the usage time of the semiconductor device further elapses, both read potentials V0 and V1 approach the reference potential (VREF). Thus, as time passes, the deterioration of memory cell is revealed, and at the instant t5 of time, the memory cell service life ends. Thus, the sense amplifier SA reaches a detection limit at the instant t5 of time. At the detection limit, the sense amplifier SA cannot detect or amplify the read potential V0 and V1 anymore. As shown in the figures, the conventional detection limit t4 is also attained at this point of time, provided the sense amplifier SA is the same.

As clear from FIGS. 4A and 4B, the service life of the ferroelectric memory provided in the semiconductor device manufactured by the manufacturing method in accordance with the present invention can be extended at least by the interval from the instant t1 of time to the instant t3 of time by comparison with the service life of the conventional ferroelectric memory. This service life extension is achieved by executing a process of writing the "0" data prior to the heating treatment process in order to shift the hysteresis curve in the minus direction of the abscissa, that is, to the left, while maintaining the shape of the entire curve, prior to shipping the semiconductor device.

2. Test Control Circuit

A test control circuit (write test circuit) that can be advantageously employed in the above-described manufacturing method and the connection arrangement thereof will be described below with reference to FIG. 5.

Other components necessary for memory operation, such as a control circuit and a redundancy circuit, are actually also present in the ferroelectric memory of the semiconductor device, but they do not represent the essence of the present invention and are neither shown in the figures nor explained in detail hereinbelow (the same is true in the explanation hereinbelow). It should be noted that the test control circuit can be produced together with the memory cells and the like by the usual wafer process in the above-described wafer fabrication process.

Figure 5:
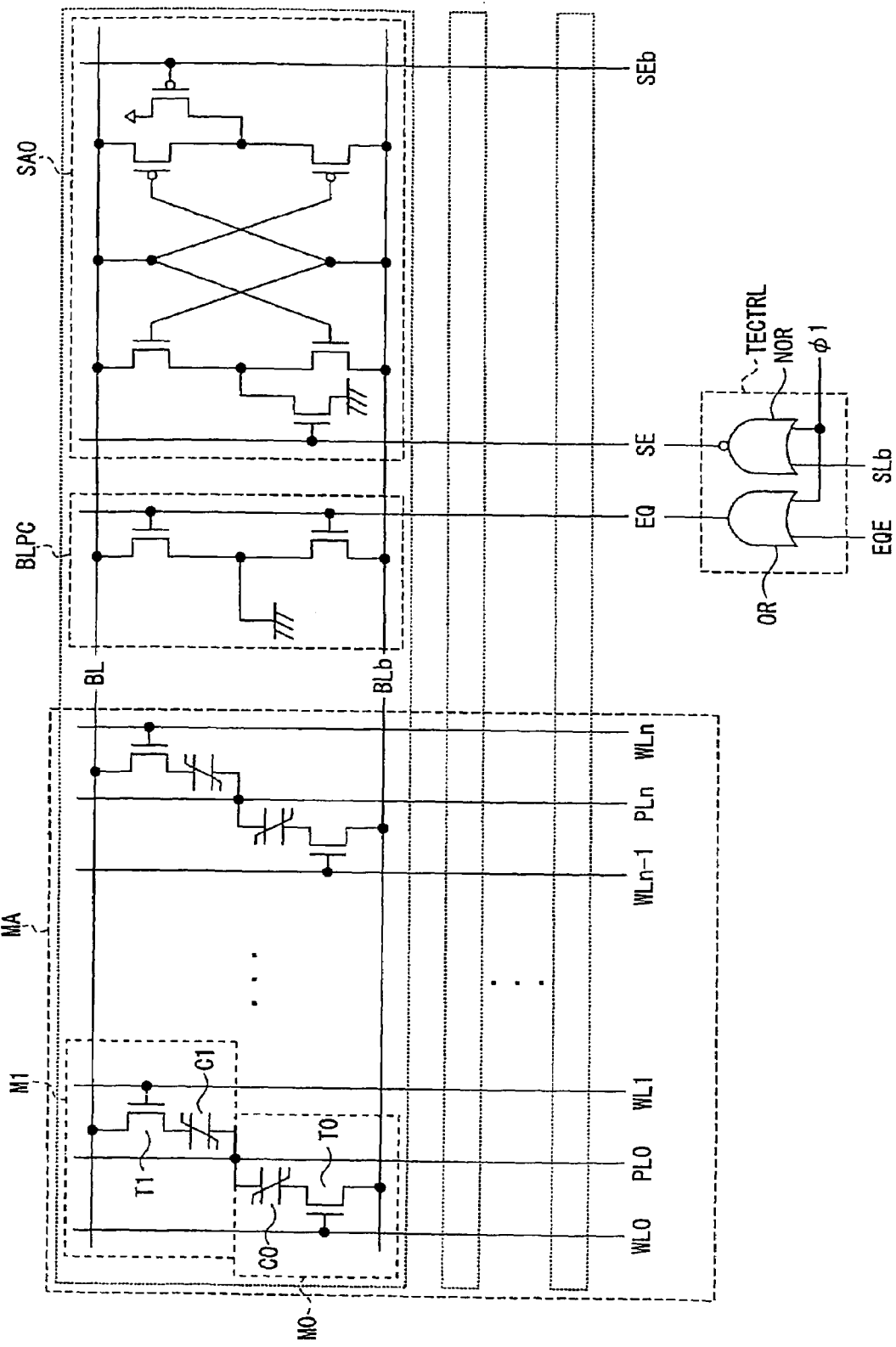
FIG. 5 is a schematic circuit diagram showing the configuration of a test control circuit (write test circuit) and connection thereof to the ferroelectric memory.

FIG. 5 is a schematic circuit diagram for explaining the configuration of a test control circuit TECTRL (write test circuit) and the connection arrangement thereof to a ferroelectric memory.

As shown in FIG. 5, the ferroelectric memory includes a memory cell array MA, a bit line precharge circuit BLPC connected to the memory cell array MA, and a sense amplifier SA0 connected to the bit line precharge circuit BLPC. The conventional well-known configurations and connection arrangement can be used for these components. Further, they do not represent the essence of the present invention. Therefore, detailed explanation thereof is sometimes omitted.

The memory cell array MA includes a plurality of memory cells disposed in the form of a matrix. In the example explained herein, memory cells of 2T2C type are used.

In FIG. 5, one column in the memory cell array MA is shown.

A first memory cell M0 includes a first access transistor T0 and a first ferroelectric capacitor C0. A second memory cell M1 includes a second access transistor T1 and a second ferroelectric capacitor C1. The first ferroelectric capacitor C0 and second ferroelectric capacitor C1 store binary data as a polarization direction of a ferroelectric.

A first word line WL0, second word line WL1, first plate line PL0, . . . (n−1)-th word line WLn−1, n-th word line WLn, and n-th plate line PLn extend in parallel to each other along the row direction of the memory cell array. The first word line WL0 and second word line WL1 make a pair, and one plate line PL0 extends between the paired two word lines.

A first bit line BL and a second bit line BLb extend in parallel to each other as a pair along the column direction of the memory cell array.

The first memory cell M0 and second memory cell M1 are disposed in the positions where the first word line WL0 and second word line WL1 cross the first bit line BL and second bit line BLb.

The first memory cell M0 includes the first access transistor T0, and the second memory cell M1 includes the second access transistor T1.

The first access transistor T0 is connected by the gate thereof to the first word line WL0, and the second access transistor T1 is connected by the gate thereof to the second word line WL1. The second bit line BLb is connected to the drain of the first access transistor T0, and the first bit line BL is connected to the drain of the second access transistor T1. One end of the first ferroelectric capacitor C0 is connected to the source of the first access transistor T0, and one end of the second ferroelectric capacitor C1 is connected to the source of the second access transistor T1. The other ends of the ferroelectric capacitors C0, C1 are connected to the first plate line PL0.

One end of a bit line precharge signal line EQ is connected to gates of two transistors of the bit line precharge circuit BLPC. The sources of those two transistors are grounded. The drain of one transistor is connected to the first bit line BL, and the drain of the other transistor is connected to the second bit line BLb. The bit line precharge signal line EQ is connected to the bit line precharge circuit BLPC so that the bit line can be maintained in the precharge state in the below-described process of writing "0" data.

One end of a sense amplifier activation signal line SE is connected to the gate of the grounded transistor of the sense amplifier SA0, so that the sense operation can be terminated in the below-described process of writing "0" data.

The other ends of the bit line precharge signal line EQ and sense amplifier activation signal line SE are connected to the test control circuit TECTRL.

The test control circuit TECTRL has two logic circuit units: an OR circuit (OR) and a NOR circuit (NOR).

More specifically, the output of the OR circuit is connected to the bit line precharge signal line EQ. A bit line precharge control signal line (first signal line) EQE for inputting a bit line precharge control signal EQE and a test signal line φ1 (second signal line) for inputting a test signal φ1 are connected to the input of the OR circuit.

The output of the NOR circuit is connected to the sense amplifier activation signal line SE. A sense amplifier activation control signal line (third signal line) SLb for inputting a sense amplifier activation control signal SLb and the test signal line φ1 (second signal line) are connected to the input of the NOR circuit.

The test control circuit TECTRL of the present invention can be composed of 10 transistors (2NOR*2+INV*1), in the minimum required configuration. Thus, a very simple configuration can be obtained. Therefore, the layout surface area in the chip is not substantially increased. As a result, value can be added without increasing the production cost of the semiconductor device.

The operation of the test control circuit TECTRL will be explained below with reference to FIG. 6.

Figure 6:
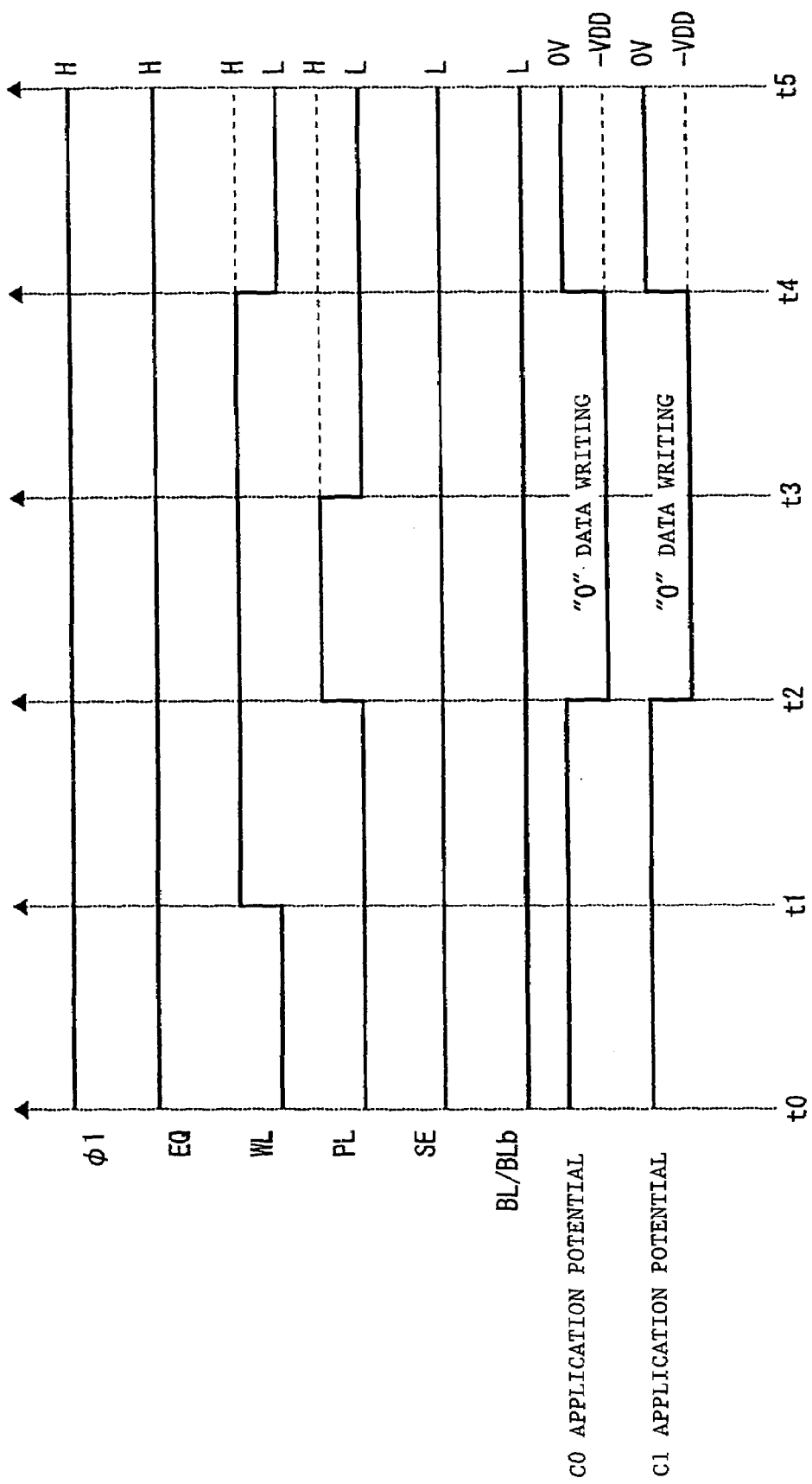
FIG. 6 is a timing chart showing the operation of the test control circuit.

FIG. 6 is a timing chart for explaining the operation of the test control circuit TECTRL. Here, "L" stands for a ground voltage and "H" stands for a power source potential VDD (same symbols are used in the explanation below).

First, at the instant t0 of time, the test signal line φ1 is set to a potential H level. As a result, the bit line precharge signal line EQ is fixed to the potential H level and the sense amplifier activation signal line SE is fixed to the potential L level, regardless of the potential level (input signal) of the bit line precharge control signal line EQE and sense amplifier activation control signal line SLb. At this time, other signals are assumed to have a potential level similar to that in the ordinary data writing operation.

Then, at the instant t1 of time, the first and second word lines WL0 and WL1 are selected and both lines make a transition from the potential L level to the potential H level.

At the instant t2 of time, the first plate line PL0 is selected and makes a transition from the potential L level to the potential H level.

At this time, because the bit line precharge signal line EQ is fixed to the potential H level, the first and second bit lines BL and BLb are fixed to the potential L level.

Therefore, at the instant t2 of time, the "0" data is written into the first and second ferroelectric capacitors C0 and C1. Thus, a − (minus) VDD voltage is applied to the first and second ferroelectric capacitors C0 and C1.

At the instant t3 of time, the first plate line PL0 is set to the potential L level.

At the instant t4 of time, the first and second word lines WL0 and WL1 are set to the potential L level and the "0" data writing is completed.

The "0" data are thus written into the first and second ferroelectric capacitors C0 and C1. At this time, the "0" data is simultaneously written into all the ferroelectric capacitors of the memory cell array MA.

Thus, if the writing process is carried out by using the test control circuit TECTRL, the "0" data can be simultaneously written in all the ferroelectric capacitors of the memory cell array MA by a simple process.

In the above-described example, the ferroelectric memory cells of the 2T2C type are used with the test control circuit TECTRL, but the present invention is not limited in this regard. For example, ferroelectric memory cells of a 1T1C type may be used with the test control circuit TECTRL.

In the above example, the configuration of the test control circuit TECTRL is explained by using logic circuit units, but the present invention is not limited in this regard. Any suitable configuration may be employed for the test control circuit TECTRL as long as the test control circuit TECTRL can maintain the precharged state of the bit line and can stop the sense operation of the sense amplifier.

3. Word Line Level (Potential) Selection Circuit

A configuration and connection arrangement of a word line level selection circuit for further extending the service life of the semiconductor device manufactured by the above-described manufacturing process will be described with reference to FIG. 7.

Figure 7:
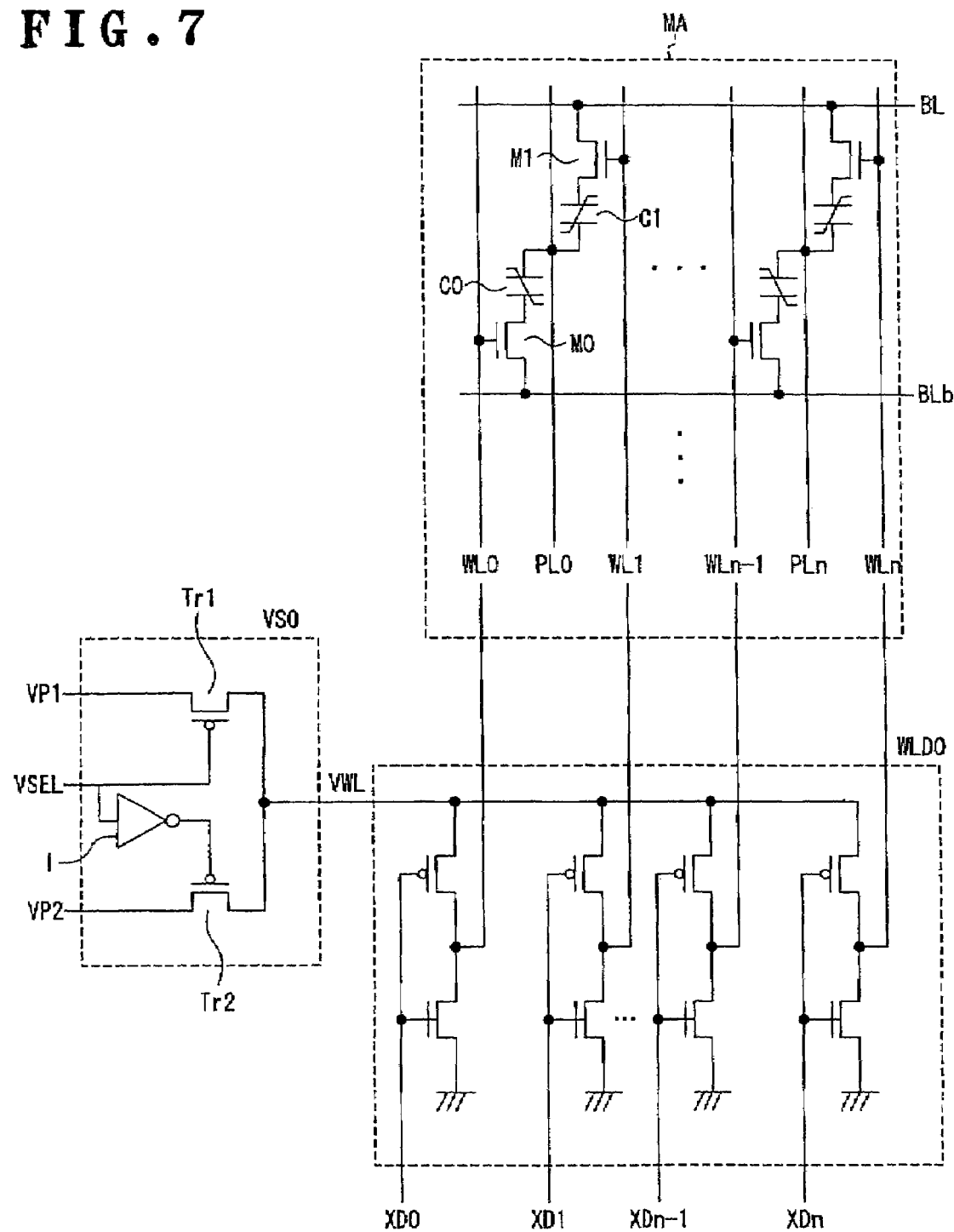
FIG. 7 is a schematic circuit diagram showing the configuration of a word line level (potential) selection circuit and connection thereof to the ferroelectric memory.

FIG. 7 is a schematic circuit diagram of the word line level (potential) selection circuit VS0 and connection thereof to the ferroelectric memory.

Similar to the test control circuit TECTRL, the word line level selection circuit VS0 is provided by the usual wafer process in the wafer fabrication process.

As shown in FIG. 7, a potential selection signal line VSEL for inputting a potential selection signal VSEL, the first potential signal line VP1 for inputting the first potential signal VP1 and the second potential signal line VP2 for inputting the second potential signal VP2 are connected to respective inputs of the word line level selection circuit VS0. A word driver circuit input signal line VWL is connected to the output of the word line level selection circuit.

As a result, the word line level selection circuit VS0 is connected to the word drive circuit WLD0. The word drive circuit WLD0 is connected by the outputs thereof to the first–n-th word lines WL0–WLn connected to the memory cell array MA (see FIG. 5). The word drive circuit WLD0 is a circuit for outputting the inputted selection potential signal VWL to a specific word line selected by the decode signals XD0–XDn of the X address supplied from the outside. The word drive circuit WLD0 may have any suitable conventional well-known configuration.

When, of the binary data stored in the ferroelectric memory cells, data is read out from a memory cell which stores the "1" data, that is, the data that will be read out at a potential level higher than the reference potential level, the word line level selection circuit VS0 conducts writing to this memory cell at a potential level lower than the power source potential.

The word line level selection circuit VS0 outputs one of the two potential signals, i.e., VP1 or VP2, to the word driver circuit WLD0 via the word driver circuit input signal line VWL.

VP1 is a signal of a potential level defined by $V1+Vt+\alpha$. Here, V1 is a potential that appears in the bit line when the "1" data is read from the ferroelectric capacitor. Vt is a threshold potential of the first and second access transistors. $\alpha$ is a potential of any quantity.

VP2 is a signal of a potential level defined by $Va+Vt$. Here, Va is a potential lower than the power source potential VDD.

In this example, the word line level selection circuit VS0 includes the first and second transistors Tr1 and Tr2 and one inverter circuit I.

The gate (control electrode) of the first transistor Tr1 is connected to the potential selection signal line VSEL for inputting the potential selection signal VSEL. The first potential signal line VP1 is connected to the source (first main electrode), thereby setting the source to the first power source potential, that is, VP1, and the drain (second main electrode) is connected to the word driver circuit input signal line VWL.

The input of the inverter circuit I is connected to the potential selection signal line VSEL, and the output thereof is connected to the gate (control electrode) of the second transistor Tr2.

The second transistor Tr2 is connected by the source (first main electrode) thereof to the second potential signal line VP2 and is therefore at the second power source potential VP2, that is, at a potential lower than VDD. The drain (second main electrode) is connected to the word driver circuit input signal line VWL. The gate (control electrode) is connected to the output of the inverter circuit I.

The above described word line level selection circuit VS0 is a mere example, and any suitable circuit configuration can be used, provided it demonstrates the above-described function.

The operation of the word line level selection circuit VS0, that is the operation of reading the "0" and "1" data from the memory cells, will be described hereinbelow with reference to FIG. 7 and FIG. 8.

Figure 8:
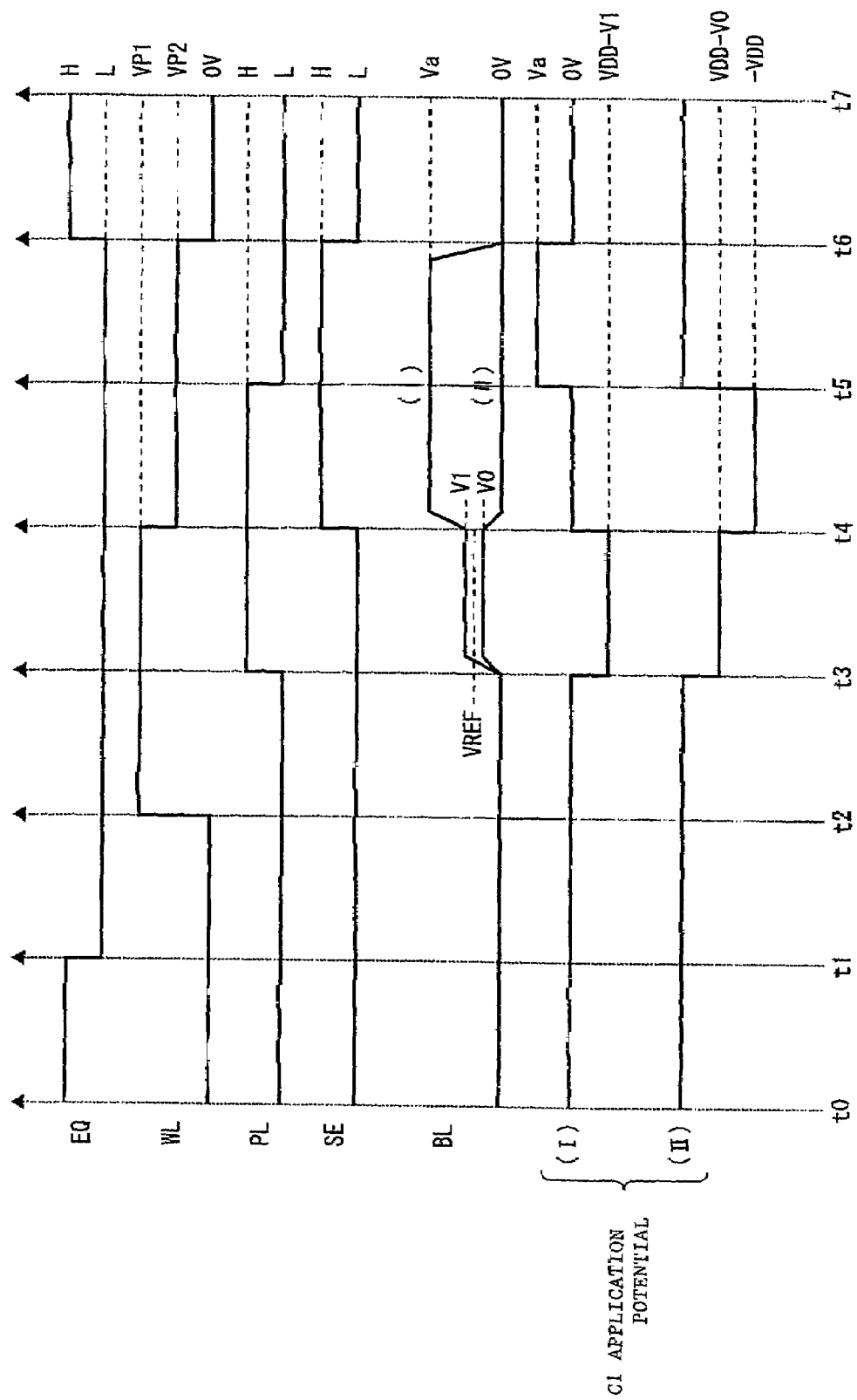
FIG. 8 is a timing chart showing the operation of the word line level selection circuit.

FIG. 8 is a timing chart for explaining the operation of the word line level selection circuit VS0.

The region i and graph I illustrate the operation of reading the "1" data. The region ii and graph II illustrate the operation of reading the "0" data.

First, at the instant t1 of time, the potential of the bit line precharge signal line EQ (see FIG. 5) is set to the L level and the first and second bit lines BL and BLb are set to a floating state.

At the instant t2 of time, the potential of the first word line WL0 makes a transition to the VP1 level and the first ferroelectric capacitor C0 is selected.

More specifically, in the transition to the VP1 level, first, the potential selection signal line VSEL of the word line level selection circuit VS0 is set to the L level. As a result, the signal of the VP1 level is outputted to the selection potential signal line VWL. The potential of the first word line WL0 is thus shifted to the VP1 level.

If the potential of the first plate line PL0 is set to the H level at the instant t3 of time, a read voltage is generated in the first bit line BL and second bit line BLb. When the data stored in the memory cell is the "1" data at this time, the operation shown in the region i is executed. Thus, a potential of the V1 level is demonstrated. When the data stored in the memory cell is the "0" data, the operation shown in the region ii is executed. Thus, a potential of the V0 level is demonstrated.

At this time, the potential applied to the capacitor C1 becomes a potential shown in the graph I, that is, VDD–V1, when the data stored in the memory cell is the "1" data. When the data stored in the memory cell is the "0" data, the potential shown in the graph II, that is, VDD–V0 is assumed.

At the instant t4 of time, the sense amplifier activation signal line SE is set to the potential H level and the sense amplifier SA0 (see FIG. 5) is activated. Due to such activation, the potential on the first bit line BL and second bit line BLb is amplified.

At the same time as the sense amplifier SA0 is activated or prior thereto and immediately after the V0 and V1 potentials appear in the first and second bit lines BL and BLb, the potential of the first and second word lines WL0 and WL1 is set to the VP2 level. As a result, in the bit line of the ferroelectric capacitor where the "1" data is stored, that is, in the drain of the access transistor T0, the Va potential is generated because the potential (potential of word line) applied to the gate of the access transistor T0 is at a VP2 level.

Therefore, as shown in the region i, the read potential of "1" data is amplified only to Va.

On the other hand, the read potential of "0" data is set to 0 (zero) V, as shown in the region ii.

The potential applied to the second ferroelectric capacitor C1 is set to 0 V, as shown in the graph I, when the "1" data is read, and becomes –VDD, as shown in the graph II, when the "0" data is read.

At the instant t5 of time, the potential of the first plate line PL0 returns to the L level. As a result, the read potential of the first bit line BL and second bit line BLb is outputted to a data bus (not shown in the figure).

At the instant t6 of time, the potential of the bit line precharge signal line EQ (see FIG. 5) is set to the H level and the potential of the first and second word lines WL0 and WL1 and the sense amplifier activation signal line SE is set to the L level. As a result, the sense amplifier SA0 stops outputting the read data.

Data of the memory cells are thus read (t7).

As described above, in the semiconductor device manufactured by the above-described manufacturing process, the word line level selection circuit VS0 is prepared in the ferroelectric memory at the wafer level, and when the "1" data is read during the operation, writing into the memory cells is carried out at a potential level lower than the power source level. Therefore, the drop of the read potential caused by the shift of the hysteresis characteristic with time in the memory cells, in particular the memory cells that continuously store the "1" data, of the ferroelectric memory can be inhibited and the service life of the ferroelectric memory can be further extended.

The service life of the ferroelectric memory (semiconductor device) having the word line level selection circuit VS0 will be described below with reference to FIGS. 9A and 9B.

Figure 9A:
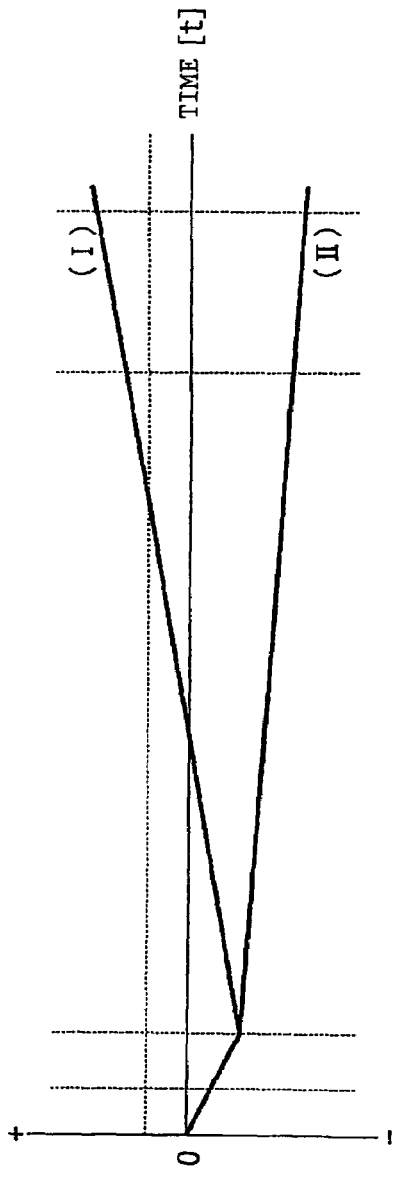
FIGS. 9A and 9B are schematic graphs useful to explain the service life of the semiconductor device equipped with the word line level selection circuit.
Figure 9B:
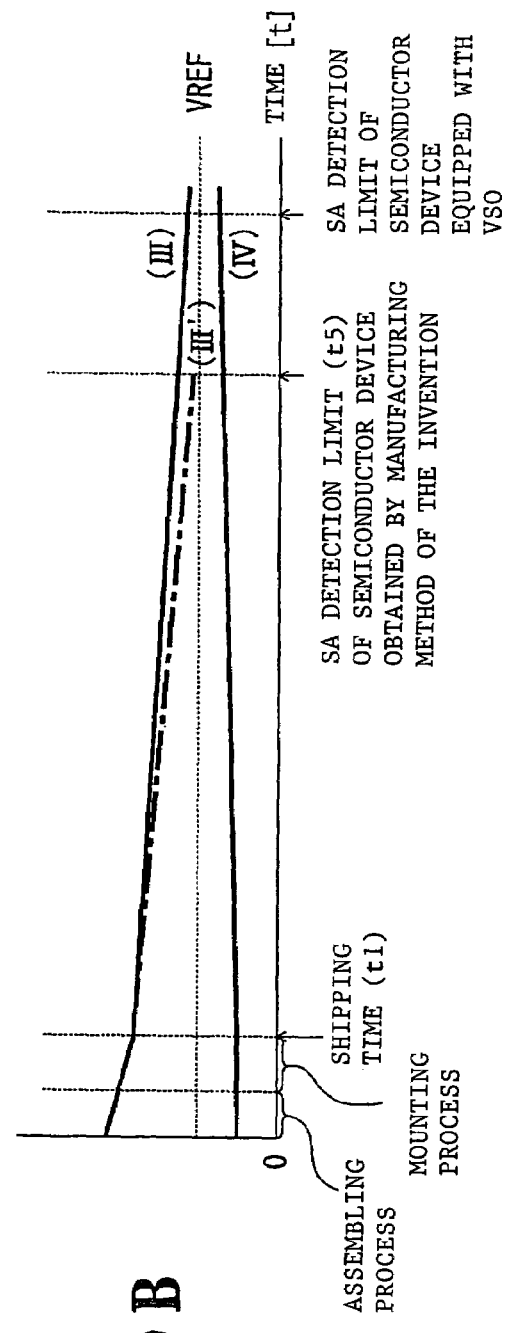
Figure 10A:
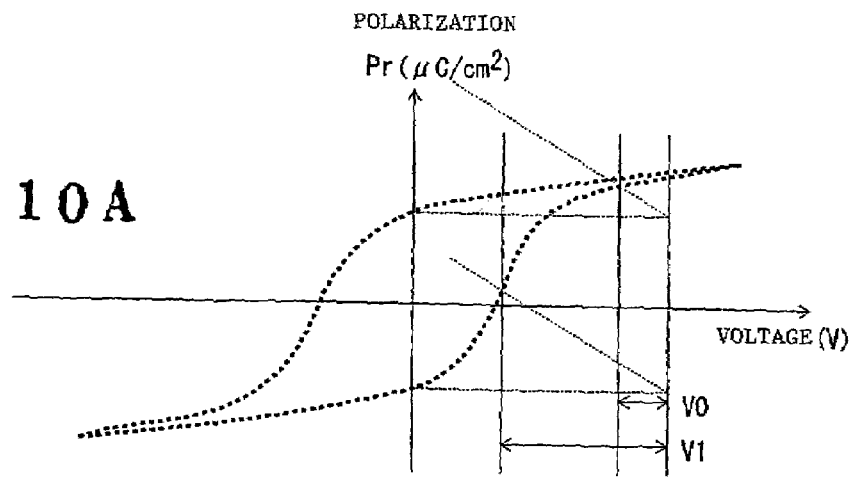
FIGS. 10A to 10C are graphs useful to explain the state transition (change in hysteresis characteristic) of a ferroelectric capacitor provided in the ferroelectric memory.
Figure 10B:
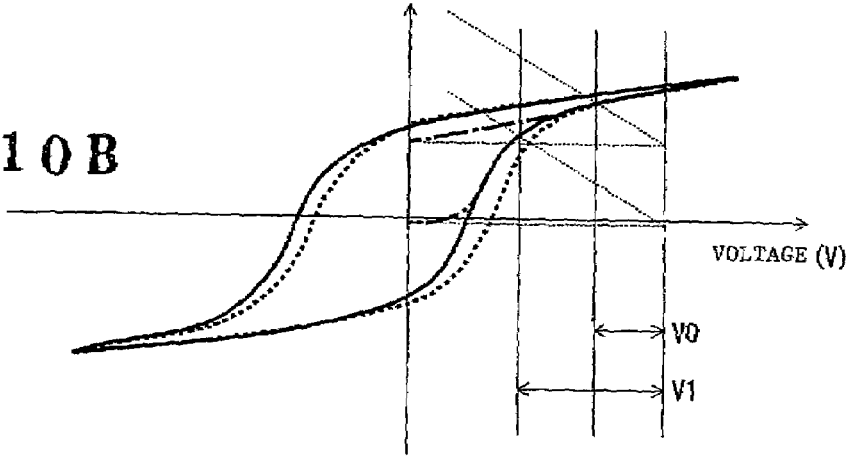
Figure 10C:
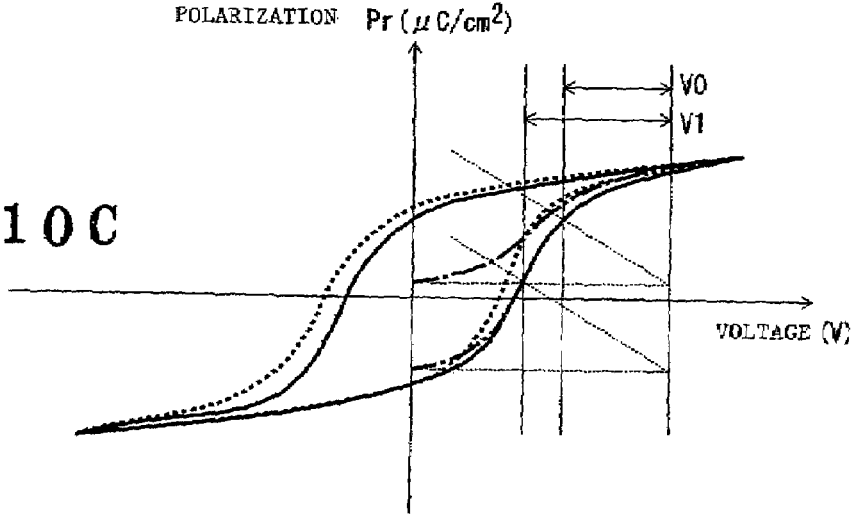
Figure 11A:
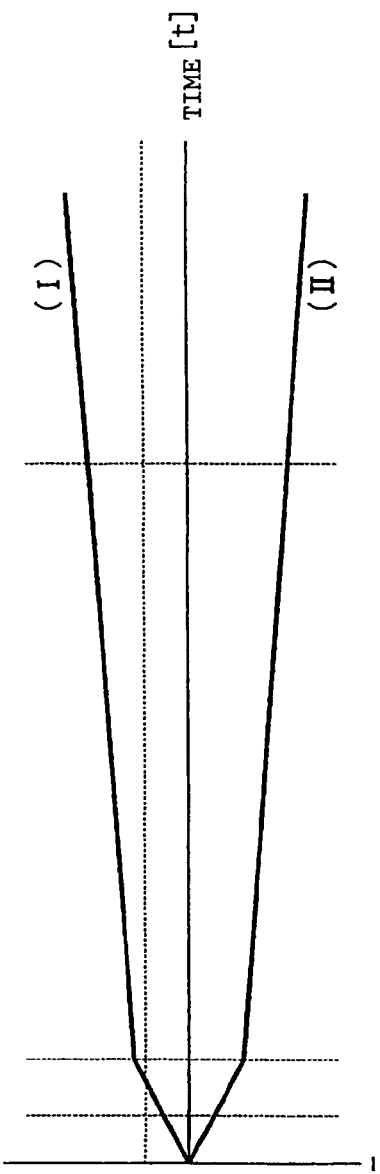
FIGS. 11A and 11B are graphs useful to explain the deterioration with time of a memory cell (ferroelectric capacitor) which holds data for a long time.
Figure 11B:
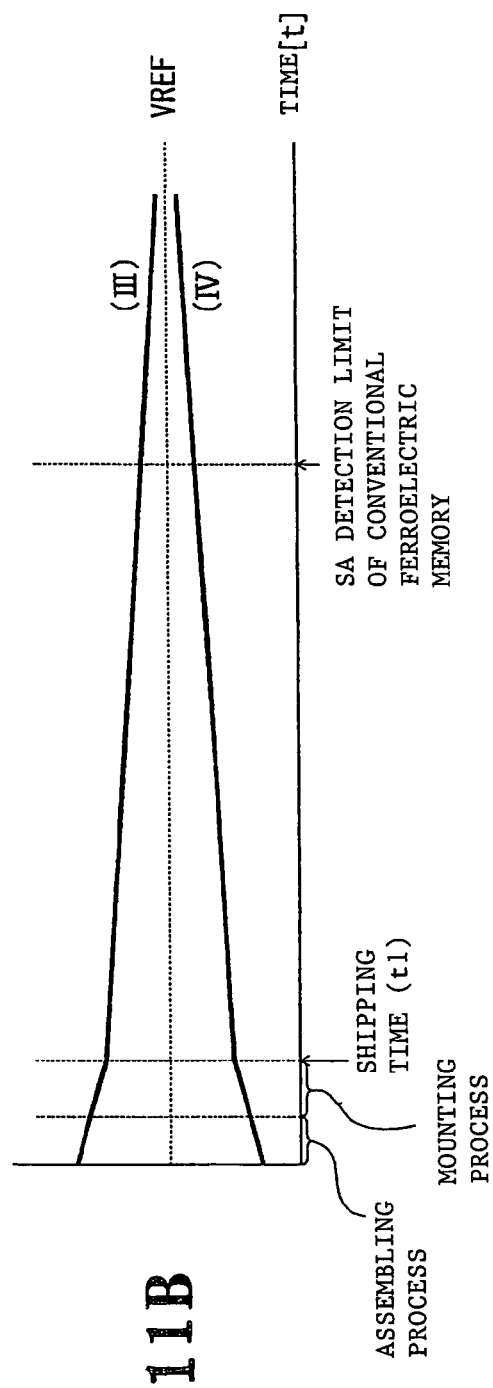

FIGS. 9A and 9B are conceptual graphs for explaining the service life of the semiconductor device with a word line level selection circuit VS0 manufactured by the above-described manufacturing method.

FIG. 9A is a conceptual graph for explaining the shift of the hysteresis curve with time. The elapsed time t is plotted against the abscissa, and the amount of shift of the hysteresis curve representing the hysteresis characteristic of the ferroelectric memory is plotted against the ordinate. The shift of the hysteresis curve to the left with respect to the point of origin 0 is represented by a minus (–) value, and the shift to the right is represented by the plus (+) value.

The graph I shows the shift of the hysteresis curve in a memory cell that has been continuously storing the "1" data, and the graph II shows the shift of the hysteresis curve in a memory cell that has been continuously storing the "0" data.

FIG. 9B is a conceptual graph for explaining changes in the read potential with time. The elapsed time t matching the time scale in FIG. 9A is plotted against the abscissa, and the read potential V is plotted against the ordinate. Graph III shows changes with time of the read potential V1 that is read from the memory cell that has been continuously storing the "1" data, and graph IV shows changes with time of the read potential V0 that is read from the memory cell that has been continuously storing the "0" data. The reference potential (VREF) which is referred to when data are read is shown by a dot line. For comparison, the shift of the hysteresis curve of the semiconductor device that is not equipped with the word line level selection circuit VS0 (explained with reference to FIG. 4) is shown by a dash-dot line of the graph III'.

As shown by the graphs I and II in FIG. 9A, in all the memory cells of the ferroelectric memory provided in the semiconductor device, imprinting has been carried out by writing the "0" data and conducting heating treatment after completion of each above-described test process. Thus, at the time of shipping, the hysteresis curve of the ferroelectric memory cell is shifted in the minus direction of the abscissa (voltage), that is, to the left, while maintaining its shape as a whole.

As shown by the graph I, in the memory cell that has been continuously holding the "1" data, the amount of hysteresis shift gradually increases in the plus (+) direction from the time of shipping (t1).

As shown in the graph II, in the memory cell that has been continuously holding the "0" data, the amount of hysteresis shift also gradually increases in the plus (+) direction from the time of shipping (t1). Eventually, the sense amplifier SA reaches the detection limit at which the detection of "0" data and "1" data becomes impossible, that is, the end of the memory cell life.

In the semiconductor device of the present invention, at the time of shipping, the hysteresis curve is already shifted in the minus direction of the abscissa (voltage), that is, to the left, while the entire shape thereof is maintained.

As seen in the graphs III and IV in FIG. 9B, the hysteresis characteristic of the memory cell shifts during usage and the read potentials V0 and V1 approach the reference potential (VREF). Thus, as the time passes, the sense amplifier SA reaches the detection limit at which the difference in potential between the read potentials V0 and V1 cannot be detected and amplified, and the service life of the memory cell ends at this time.

The comparison of the graph III and graph III' clearly shows that when the ferroelectric memory additionally includes the word line level selection circuit VS0 and reads the "1" data, writing into this memory cell is conducted at a potential level lower than the power source potential. Therefore, the shift of the hysteresis curve of the ferroelectric memory to the right can be further delayed. Consequently, the time till the sense amplifier SA reaches the detection limit can be further extended. In other words, the service life of the semiconductor device can be further extended.

This application is based on Japanese Patent Application No. 2004-132685 filed on Apr. 28, 2004, and the entire disclosure thereof is incorporated herein by reference.

What is claimed is:

1. A method of manufacturing a ferroelectric memory, the ferroelectric memory having a plurality of memory cells to store binary data as polarization states of a ferroelectric, the method comprising:
   providing a plurality of memory cells;
   writing binary data to be read at a potential level lower than a reference potential level during data reading, to all of said plurality of memory cells prior to a heat treatment; and
   connecting a write test circuit to said plurality of memory cells, the write test circuit being adapted to maintain precharging of a bit line and terminate a sense operation of a sense amplifier, wherein said writing binary data includes writing said binary data simultaneously to all the memory cells by using said write test circuit.

2. The method of manufacturing a ferroelectric memory according to claim 1, wherein said write test circuit has an OR circuit and a NOR circuit, said OR circuit has an output connected to a bit line precharge circuit and has an input connected to a first signal line on which a bit line precharge signal is inputted and to a second signal line on which a test signal is inputted, and said NOR circuit has an output connected to a sense amplifier and an input connected to said second signal line and to a third signal line on which a sense amplifier activation main control signal is inputted.

3. A method of manufacturing a ferroelectric memory, the ferroelectric memory having a plurality of memory cells to store binary data as polarization states of a ferroelectric, the method comprising:
   providing a plurality of memory cells;
   writing binary data to be read at a potential level lower than a reference potential level during data reading, to all of said plurality of memory cells prior to a heat treatment; and
   providing a word line potential selection circuit, wherein the word line potential selection circuit writes binary data into one of said memory cells at a potential level lower than a power source potential when said stored binary data is read from said one of said memory cells at a potential level higher than the reference potential level, and outputs two different potential level signals to a word driver circuit when a potential selection signal is inputted to the word line potential selection circuit.

4. The method of manufacturing a ferroelectric memory according to claim 3, wherein said word line potential selection circuit includes:
   a first transistor having a control electrode connected to a potential selection signal line on which said potential selection signal is inputted, a first main electrode set to a first power source potential, and a second main electrode connected to a word driver circuit input signal line;
   an inverter circuit having an input and an output, the input being connected to said potential selection signal line; and
   a second transistor having a first main electrode set to a second power source potential, a second main electrode connected to said word driver circuit input signal line, and a control electrode connected to the output of said inverter circuit.

5. The method of manufacturing a ferroelectric memory according to claim 3, wherein said binary data to be read at a potential level lower than a reference potential level is 0 data, and said binary data to be read at a potential level higher than the reference potential level is 1 data.

6. A method of manufacturing a semiconductor device, comprising:
   manufacturing a ferroelectric memory having a plurality of memory cells for storing binary data as polarization states of a ferroelectric; and
   manufacturing a semiconductor device having said ferroelectric memory; wherein said manufacturing a ferroelectric memory includes
   preparing the plurality of memory cells and writing binary data to be read at a potential level lower than a reference potential level during data reading, to all of said plurality of memory cells prior to a first heat treatment, and said manufacturing a semiconductor device includes writing binary data to be read at a potential level lower than the reference potential level during data reading, to all of said plurality of memory cells prior to a second heat treatment, and
   connecting a write test circuit to said plurality of memory cells, the write test circuit being adapted to maintain precharging of a bit line and terminate a sense operation of a sense amplifier, wherein each of said writing binary data includes writing said binary data simultaneously to all the memory cells of said ferroelectric memory by using said write test circuit.

7. The method of manufacturing a semiconductor device according to claim 6, wherein said write test circuit has an OR circuit and a NOR circuit, said OR circuit has an output connected to a bit line precharge circuit of said ferroelectric memory and has an input connected to a first signal line on which a bit line precharge signal is inputted and to a second signal line on which a test signal is inputted, and said NOR circuit has an output connected to a sense amplifier and an input connected to said second signal line and to a third signal line on which a sense amplifier activation main control signal is inputted.

8. A method of manufacturing a semiconductor device, comprising:
   manufacturing a ferroelectric memory having a plurality of memory cells for storing binary data as polarization states of a ferroelectric; and manufacturing a semiconductor device having said ferroelectric memory; wherein said manufacturing a ferroelectric memory includes preparing the plurality of memory cells and writing binary data to be read at a potential level lower than a reference potential level during data reading, to all of said plurality of memory cells prior to a first heat treatment, and said manufacturing a semiconductor device includes writing binary data to be read at a potential level lower than the reference potential level during data reading, to all of said plurality of memory cells prior to a second heat treatment, and providing a word line potential selection circuit, wherein the word line potential selection circuit writes binary data into one of said memory cells at a potential level lower than a power source potential when said stored binary data is read from said one of said memory cells at a potential level higher than the reference potential level, and outputs two different potential level signals to a word driver circuit when a potential selection signal is inputted to the word line potential selection circuit.

9. The method of manufacturing a semiconductor device according to claim 8, wherein said word line potential selection circuit includes:

a first transistor having a control electrode connected to a potential selection signal line on which said potential selection signal is inputted, a first main electrode set to a first power source potential, and a second main electrode connected to a word driver circuit input signal line;

an inverter circuit having an input and an output, the input being connected to said potential selection signal line; and a second transistor having a first main electrode set to a second power source potential, a second main electrode connected to said word driver circuit input signal line, and a control electrode connected to the output of said inverter circuit.

10. The method of manufacturing a semiconductor device according to claim 8, wherein said binary data to be read at a potential level lower than a reference potential level is 0 data, and said binary data to be read at a potential level higher than the reference potential level is 1 data.

11. A ferroelectric memory comprising a plurality of memory cells to store binary data as polarization states of a ferroelectric, wherein binary data to be read at a potential level lower than a reference potential level during data reading is written to all of said plurality of memory cells prior to a heat treatment; and a write test circuit connected to said plurality of memory cells for maintaining precharging of a bit line and for terminating a sense operation of a sense amplifier, wherein said binary data is written simultaneously to all the memory cells by using said write test circuit.

12. A ferroelectric memory comprising a plurality of memory cells to store binary data as polarization states of a ferroelectric, wherein binary data to be read at a potential level lower than a reference potential level during data reading is written to all of said plurality of memory cells prior to a heat treatment, wherein said write test circuit has an OR circuit and a NOR circuit, said OR circuit has an output connected to a bit line precharge circuit and has an input connected to a first signal line on which a bit line precharge signal is inputted and to a second signal line on which a test signal is inputted, and said NOR circuit has an output connected to a sense amplifier and an input connected to said second signal line and to a third signal line on which a sense amplifier activation main control signal is inputted.

13. A ferroelectric memory comprising a plurality of memory cells to store binary data as polarization states of a ferroelectric, wherein binary data to be read at a potential level lower than a reference potential level during data reading is written to all of said plurality of memory cells prior to a heat treatment; and a word line potential selection circuit for writing binary data into one of said memory cells at a potential level lower than a power source potential when said stored binary data is read from said one of said memory cells at a potential level higher than the reference potential level, and for outputting two different potential level signals to a word driver circuit when a potential selection signal is inputted to the word line potential selection circuit.

14. The ferroelectric memory according to claim 13, wherein said word line potential selection circuit includes:

a first transistor having a control electrode connected to a potential selection signal line on which said potential selection signal is inputted, a first main electrode set to a first power source potential, and a second main electrode connected to a word driver circuit input signal line;

an inverter circuit having an input and an output, the input being connected to said potential selection signal line; and a second transistor having a first main electrode set to a second power source potential, a second main electrode connected to said word driver circuit input signal line, and a control electrode connected to the output of said inverter circuit.

15. The ferroelectric memory according to claim 13, wherein said binary data to be read at a potential level lower than a reference potential level is 0 data, and said binary data to be read at a potential level higher than the reference potential level is 1 data.

* * * * *